(12) United States Patent
Yabuki et al.

(10) Patent No.: US 7,985,474 B2
(45) Date of Patent: Jul. 26, 2011

(54) WAFER-DICING ADHESIVE TAPE AND METHOD OF PRODUCING CHIPS USING THE SAME

(75) Inventors: Akira Yabuki, Tokyo (JP); Syozo Yano, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 11/892,905

(22) Filed: Aug. 28, 2007

(65) Prior Publication Data

US 2008/0008881 A1 Jan. 10, 2008

Related U.S. Application Data

(63) Continuation of application No. PCT/JP2006/306309, filed on Mar. 28, 2006.

(30) Foreign Application Priority Data

Mar. 29, 2005 (JP) ................................. 2005-095810

(51) Int. Cl.
 *B32B 7/12* (2006.01)
(52) U.S. Cl. ................................. 428/355 AC; 428/343
(58) Field of Classification Search .......................... None
 See application file for complete search history.

(56) References Cited

U.S. PATENT DOCUMENTS

| 5,281,473 | A | * | 1/1994 | Ishiwata et al. | ............... | 428/345 |
| 5,476,566 | A | | 12/1995 | Cavasin | | |
| 5,942,578 | A | * | 8/1999 | Noguchi et al. | ............... | 525/228 |
| 5,976,691 | A | * | 11/1999 | Noguchi et al. | ............... | 428/354 |
| 6,040,048 | A | * | 3/2000 | Kato et al. | ................... | 428/345 |
| 6,398,892 | B1 | | 6/2002 | Noguchi et al. | | |
| 6,702,910 | B2 | * | 3/2004 | Noguchi et al. | ................ | 156/85 |
| 2001/0014492 | A1 | * | 8/2001 | Noguchi et al. | .............. | 438/118 |
| 2003/0139019 | A1 | * | 7/2003 | Kudo et al. | ................... | 438/460 |

FOREIGN PATENT DOCUMENTS

| EP | 1 122 776 A2 | 8/2001 |
| JP | 5-211234 A | 8/1993 |
| JP | 7-235583 A | 9/1995 |
| JP | 2000-124169 A | 4/2000 |
| JP | 2000-136362 A | 5/2000 |
| JP | 2001-200215 A | 7/2001 |
| JP | 2003-7646 A | 1/2003 |
| JP | 2005-263879 A | 9/2005 |

OTHER PUBLICATIONS

English machine translation of JP2003-007646 as translated on Aug. 2, 2009.*
Benedek I. Pressure-Sensitive Adhesives Technology, 1997, Marcel Dekker Inc., p. 188.*

* cited by examiner

*Primary Examiner* — Timothy M Speer
*Assistant Examiner* — Adam C Krupicka
(74) *Attorney, Agent, or Firm* — Birch, Stewart, Kolasch & Birch, LLP

(57) ABSTRACT

A wafer-dicing adhesive tape, containing two or more removable adhesive layers, on a base film, that have resin compositions containing a radiation-polymerizable compound, in which a content of the radiation-polymerizable compound in the resin composition constituting an outermost removable adhesive layer is different from that of an inner removable adhesive layer and a stress applied to the base film is sufficiently introduced to the outermost removable adhesive layer irradiated with radiation, so that said layer can be easily peeled off from chips cut; and a method of producing chips using the same.

8 Claims, 3 Drawing Sheets

WAFER-DICING ADHESIVE TAPE AND METHOD OF PRODUCING CHIPS USING THE SAME

This application is a Continuation of copending PCT International Application No. PCT/JP2006/306309 filed on Mar. 28, 2006, which designated the United States, and on which priority is claimed under 35 U.S.C. §120. This application also claims priority under 35 U.S.C. §119(a) on Patent Application No(s). 2005-095810 filed in Japan on Mar. 29, 2005. The entire contents of each of the above documents is hereby incorporated by reference.

TECHNICAL FIELD

The present invention relates to a wafer-dicing adhesive tape and a method of producing chips using the same.

BACKGROUND ART

In recent years, semiconductor chips have been remarkably evolved to thin-filmed and smaller-sized chips. In particular, in the case of IC cards, such as memory cards and smart cards, in which semiconductor IC chips are embedded, the semiconductor chips each require a thickness of 100 μm or less. As those demands will increase in the future, it is assumed that the needs for the above thin-filmed and small-sized chips increase much more.

Those semiconductor chips can be obtained by processing a semiconductor wafer into a thin film having a predetermined thickness by a back-grinding process, etching process, or the like, and then supporting and fixing the semiconductor wafer with a dicing tape or the like, followed by chipping with a dicing process. Subsequently, when the dicing tape has a removable adhesive layer of a radiation-curable type, the chips are transferred to a pick-up process after irradiating with radiation, such as ultraviolet rays or electron beams, and then mounted on a lead frame or the like after passing through pick-up and die-bonding processes.

Of a series of the above processes, for the dicing process, a general method is a blade-cutting system involving cutting a semiconductor wafer with a dicing blade while supporting and fixing the semiconductor wafer with a dicing tape. In this case, however, the blade is set to a rotational frequency of several tens of thousands rpm in approximate and thus the blade will have frictional heat by receiving considerable cutting resistance. In some cases, the blade may have an increased surface temperature of about 100° C. In general, when the wafer is fully cut off, depending on circumstances, the base film of the tape can be also cut off with a blade and thus a part of the base film can be molten by heat of the blade. As a result, there is a case that filamentous dicing waste is generated and scooped out on the surface pattern of the wafer. When, for example, the waste adheres on an electrode pad, there is a possibility of leading to trouble in subsequent wire-bonding. In the case of a thick wafer as before, even if filamentous dicing waste has been generated, the degree of the generation is to the extent that it remains on the chip side. For this reason, there was no fear of leading to trouble in wire bonding as mentioned above. However, the formation of a wafer into a thin film in recent years tends to allow filamentous dicing waste to be generated even on the surface of the wafer, causing the trouble as mentioned above to be more serious.

For the method of solving such a trouble, a tape for processing a wafer in which a removable adhesive agent is applied on a cross-linked base film has been proposed (see, for example, JP-A-5-211234 ("JP-A" means unexamined published Japanese patent application)). In addition, there is proposed a method involving forming a viscoelastic layer hardened by an energy beam on a base film and confining the cut in an adhesive sheet for dicing by dicing up to the viscoelastic layer but not to the base film (see, for example, JP-A-2003-7646).

However, in the former, the base film is cut with a blade under a high-temperature condition, and thus it is not necessarily sufficient when the thickness of the wafer is in the range of 100 μm or less. In the latter, on the other hand, the blade does not cut the base film, so that no incident such as the generation of filamentous dicing waste by fusion of the tape due to the heat of the blade as described above occurs. In this case, however, the viscoelastic layer is very thick as much as 300 μm in maximum thickness and is formed as a hard layer hardened by an energy beam. Thus, fine powdery cutting waste may be undesirably caused from the viscoelastic layer when the blade cuts the viscoelastic layer at the time of dicing. In addition, if the powdery cutting waste has adhered on an electrode pad having a patterned surface, there is a problem in that the possibility of leading to poor wire-bonding may occur and simultaneously the remarkable abrasion of the blade may occur owing to cut of the thick, hardened viscoelastic layer to lead to a decrease in lifetime of the blade.

DISCLOSURE OF INVENTION

The present invention provides a wafer-dicing adhesive tape used for supporting and fixing a work to be cut such as a wafer at the time of processing the work, that can be produced without carrying out a special processing, such as a cross-linking of a base film, and without generating cutting waste at the time of dicing, and that is excellent in pick-up property. Further, the present invention provides a method of producing chips using the same.

The present inventors have keenly studied to solve the above-described problems in conventional technique. As a result, the present inventors found that a wafer-dicing adhesive tape comprising two or more removable adhesive layers that have resin compositions containing a radiation-polymerizable compound, in which a content of the radiation-polymerizable compound in the resin composition constituting an outermost removable adhesive layer is different from that of an inner removable adhesive layer, can be reduced in cutting waste at the time of dicing and is excellent in pick-up property.

According to the present invention, there are provided the following means:

(1) A wafer-dicing adhesive tape, comprising two or more removable adhesive layers, on a base film, that have resin compositions containing a radiation-polymerizable compound, wherein a content of the radiation-polymerizable compound in the resin composition constituting an outermost removable adhesive layer is different from that of an inner removable adhesive layer; and wherein a stress applied to the base film is sufficiently introduced to the outermost removable adhesive layer irradiated with radiation, so that said layer can be easily peeled off from chips cut;

(2) The wafer-dicing adhesive tape according to the above item (1), wherein the content of the radiation-polymerizable compound in the resin composition constituting the outermost layer of the removable adhesive layer is larger than the content of the radiation-polymerizable compound in the resin composition constituting the inner removable adhesive layer;

(3) The wafer-dicing adhesive tape according to the above item (1) or (2), wherein the resin composition constituting the outermost layer of the removable adhesive layer contains 50 to 200 parts by mass of the radiation-polymerizable compound for 100 parts by mass of an acrylic base resin, and wherein the resin composition constituting the inner removable adhesive layer contains 5 to 100 parts by mass of the radiation-polymerizable compound for 100 parts by mass of an acrylic base resin; and (4) A method of producing chips, comprising the steps of:
supporting and fixing a wafer as a work to be cut with the wafer-dicing adhesive tape according to any one of the above items (1) to (3);
dicing the wafer such that a lowest part of cutting blade reaches inside of the outermost layer of the wafer-dicing adhesive tape or the inner removable adhesive layer present in the inner part to the outermost layer;
irradiating the water-dicing adhesive tape with radiation; and
picking up the thus-obtained chips cut.

The wafer-dicing adhesive tape of the present invention can be produced without carrying out a specific processing such as cross-linkage in the base film. In addition, a method of efficiently producing chips using such a tape without causing any cutting waste at dicing can be provided.

Other and further features and advantages of the invention will appear more fully from the following description, taken in connection with the accompanying drawings.

BRIEF DESCRIPTION OF DRAWINGS

FIG. 4(a) is a cross sectional diagram showing the state in which the chips are cut out, FIG. 4(b) is a cross sectional diagram showing the state in which one of the chips is pushed up by pushing-up pins, and FIG. 4(c) is a cross sectional diagram showing the state in which it is picked up by an adsorption collet.

FIG. 5(a) is a cross sectional diagram showing the state in which chips are cut out, FIG. 5(b) is a cross sectional diagram showing the state in which one of the chips is pushed up by pushing-up pins, and FIG. 5(c) is a cross sectional diagram showing the state in which it is picked up by an adsorption collet.

DESCRIPTION OF LETTERS OR NUMERALS

Figure 1:
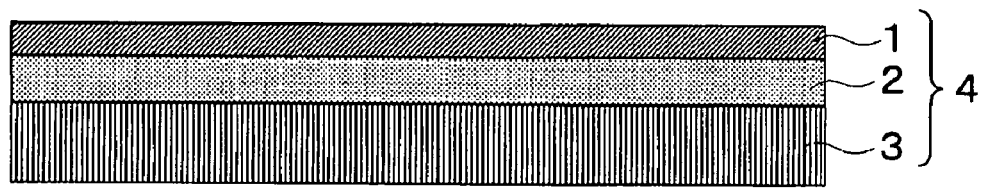
FIG. 1 is a cross sectional diagram that illustrates the cross section of the wafer-dicing adhesive tape of the present invention.

1: Outermost removable adhesive layer
2: Inner removable adhesive layer
3: Base film
4: Wafer-dicing adhesive tape
5: Wafer
5': Chip(s)
6: Scribing line
7: Blade
8: Ring frame
9: Fixing chuck table
10: Adsorption stage
11: Pushing-up pins
12: Adsorption collet
13: Inner removable adhesive layer not containing radiation-polymerizable compound
14: Wafer-dicing adhesive tape in which the inner removable adhesive layer is made of a resin composition free of a radiation-polymerizable compound
15: Delamination-starting portion on the ends of the chip

BEST MODE FOR CARRYING OUT THE INVENTION

Hereinafter, the present invention will be described in detail.

Herein, the term "removable adhesive" means an agent capable of adhering and being removed after treatment such as curing.

Figure 2:
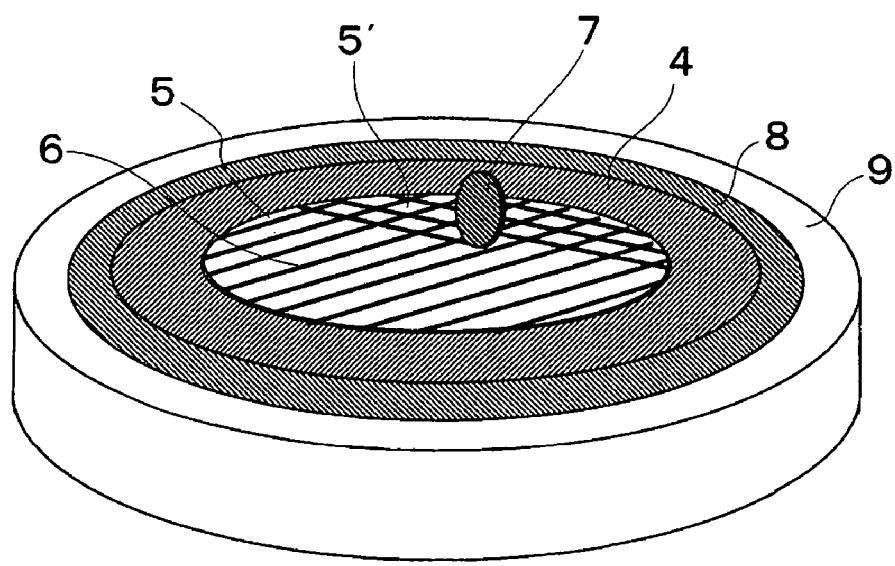
FIG. 2 is an explanation diagram that represents a process for dicing a semiconductor wafer using a blade.

A wafer-dicing adhesive tape 4 of the present invention, as shown in the cross sectional diagram of FIG. 1, includes an inner removable adhesive layer 2 and an outermost removable adhesive layer 1, in this order, formed on a base film 3. As shown in the explanation diagram of the perspective diagram of FIG. 2, the wafer-dicing adhesive tape 4 of the present invention is applied to a ring frame 8 having a doughnut-shape through the outermost removable adhesive layer 1 and mounted on a fixing chuck table 9 such that the outermost removable adhesive layer 1 faces upward. After that, a wafer 5 to be chipped is applied on the outermost removable adhesive layer 1 and then cut into chips 5' with a blade 7.

Figure 3:
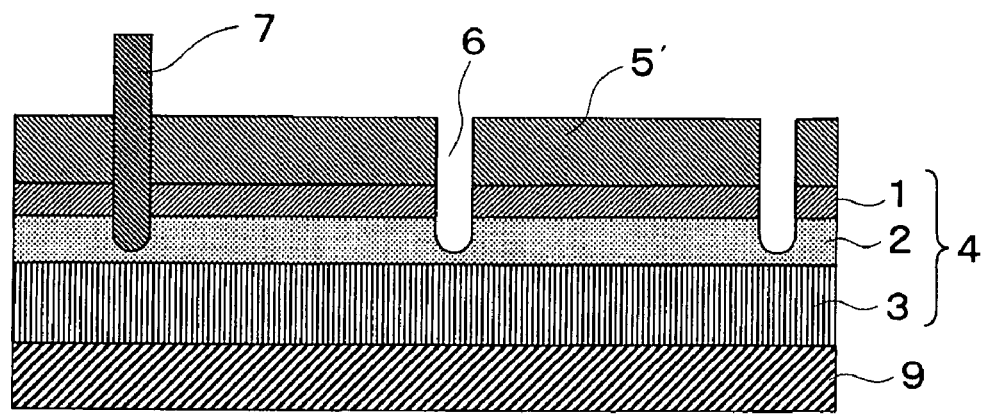
FIG. 3 is a cross sectional diagram that illustrates the state in which the lowest potion of the cut in a blade is in a removable adhesive layer 2 in the dicing process.

As shown in the cross sectional diagram of FIG. 3, the wafer-dicing adhesive tape 4 of the present invention is preferably chipped together with the chips 5' with the blade 7 such that the blade 7 does not reach the base film 3. When the lowest part of the cutting blade 7 at dicing exceeds the inner removable adhesive layer 2 and reaches the base film 3, filamentous cutting waste is generated at dicing. In the dicing process, the cutting is carried out along a scribing line 6 formed on the wafer 5.

In the present invention, a resin composition constituting the outermost removable adhesive layer 1 located opposite to the base film 3 contains a radiation-polymerizable compound and the temporary adhesion strength thereof is thus lowered by irradiation. However, the wafer-dicing adhesive tape 4 of the present invention is not exposed to radiation irradiation until the dicing process as shown in FIG. 3 is carried out, thereby allowing the wafer to be sufficiently retained. Therefore, at the time of dicing, fine powdery cutting waste is not generated from the hardened removable adhesive layer.

Figure 4:
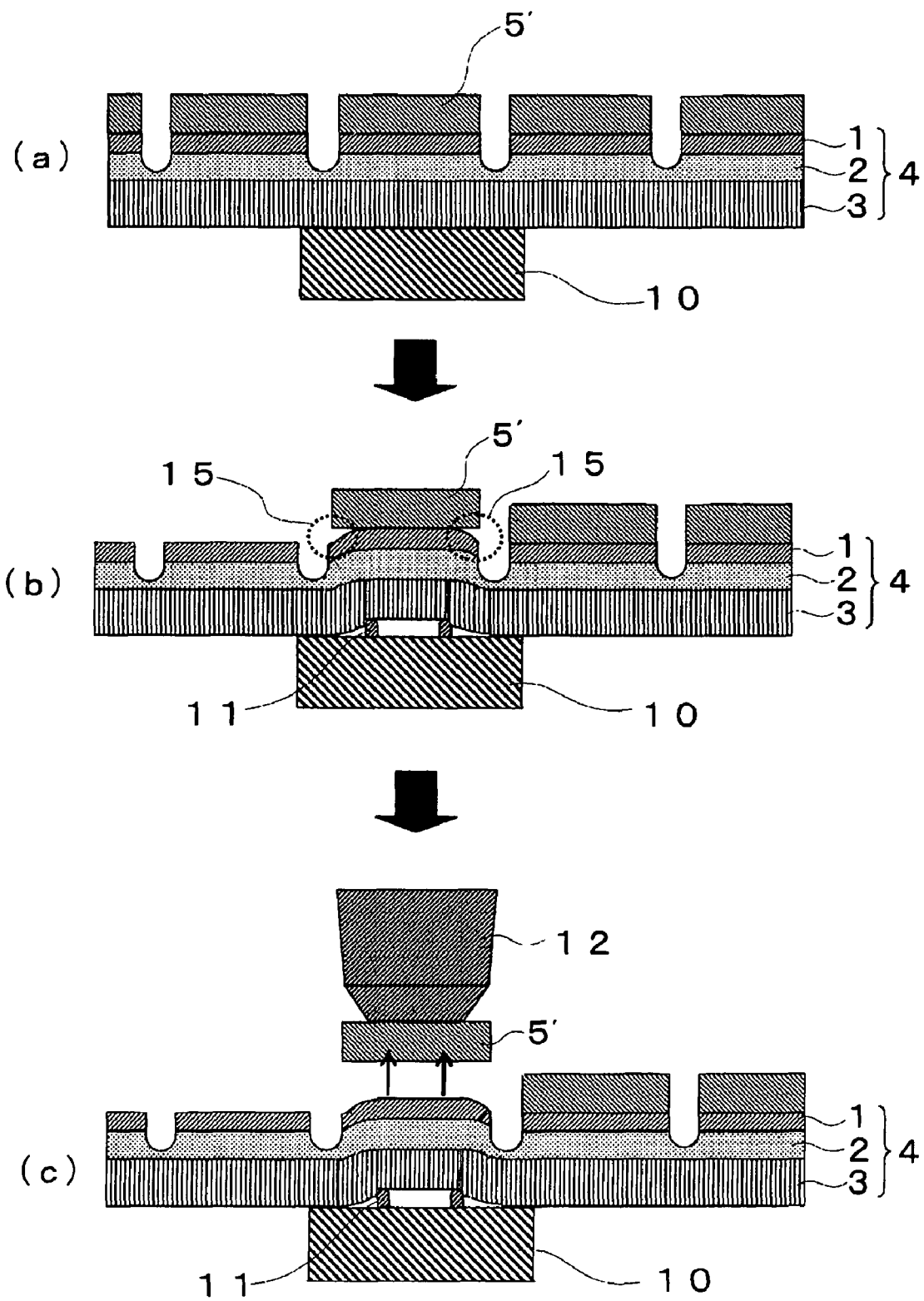
FIGS. 4(a) to 4(c) each are a cross sectional diagram that illustrates a process for picking up semiconductor chips using the dicing tape of the present invention, where

When the wafer-dicing adhesive tape 4 of the present invention is used, the cut chip 5' as shown in the cross sectional diagram of FIG. 4(a) is pushed up by pushing-up pins 11 from the back side of the base film 3 of the wafer-dicing adhesive tape 4 as shown in the cross sectional diagram of FIG. 4(b). The stress on this occasion is sufficiently introduced to the chip 5' to deform the shape of the tape at the ends of the chip 5'. Thus, such deformation causes a delamination-starting portion 15 of the tape on the ends of the chip 5'. Furthermore, the inner removable adhesive layer 2 also contains a radiation-polymerizable compound, so that the temporary adhesion strength can be extensively adjusted so as to cause a delamination-starting portion 15 of the ends of the chip easily. Subsequently, as shown in the cross sectional diagram of FIG. 4(c), the cut chip 5' is picked up by an adsorption collet 12. Herein, the reference numeral 10 in the drawings refers to an adsorption stage.

Figure 5:
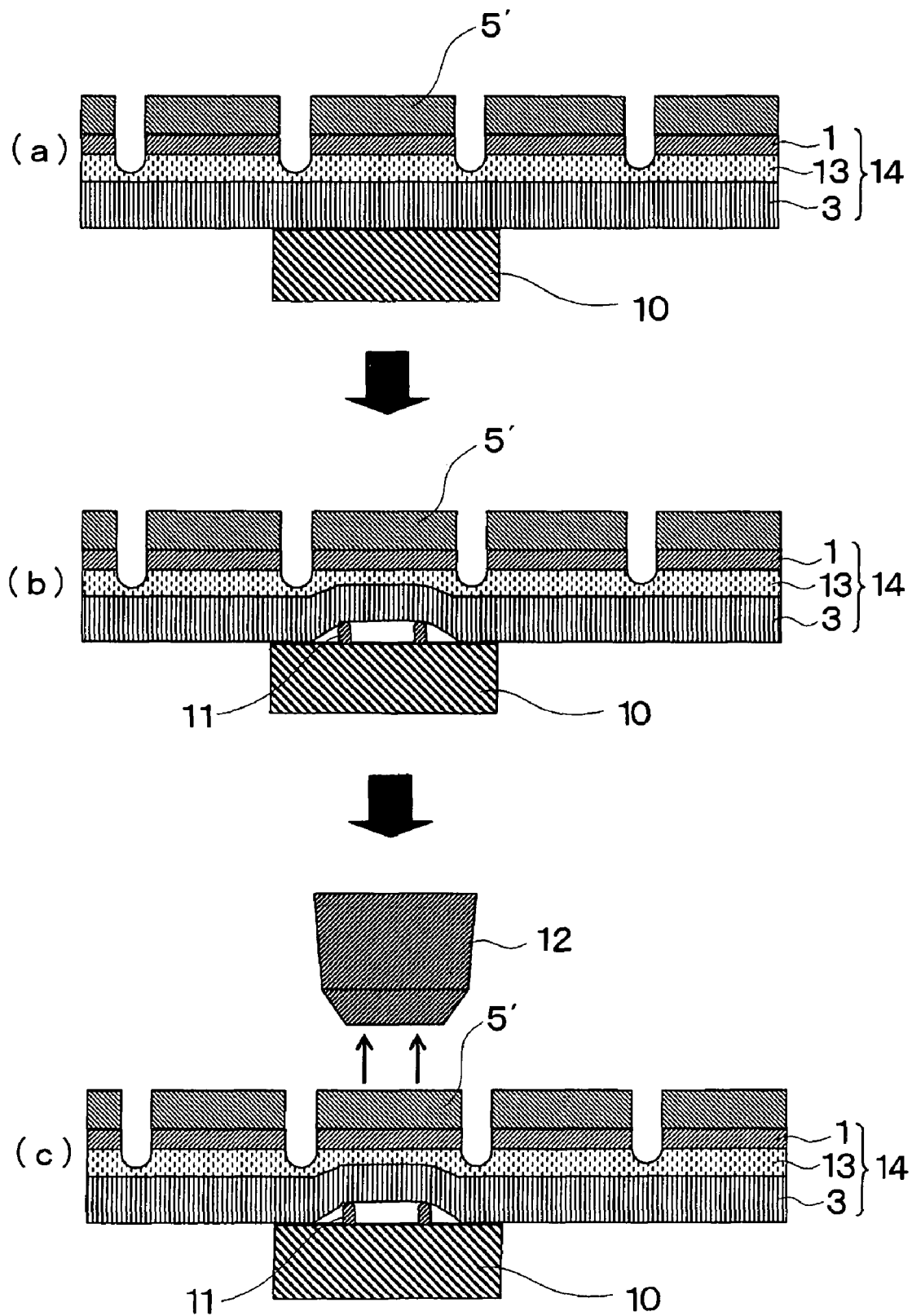
FIGS. 5(a) to 5(c) each are a cross sectional diagram that illustrates the pick-up process in the case of using a dicing tape in which a removable adhesive layer on a base film is a non-radiation-curable type removable adhesive layer, where

In contrast, in the case of a wafer-dicing adhesive tape 14 as shown in the cross sectional diagram of FIG. 5(*a*), in which the inner removable adhesive layer 13 is made of a resin composition free of a radiation-polymerizable compound, even if the chip 5' is subsequently pushed up by the pushing-up pins 11 from the side of the base film 3 as shown in the cross sectional diagram of FIG. 5(*b*), the stress of the pushing up by the pushing-up pins 11 is absorbed by the deformation of the inner removable adhesive layer 13 free of the radiation-polymerizable compound. As a result of no introduction of stress to the chip 5', the delamination-starting portion of the ends of the chip 5' cannot be generated and any trouble may occur in pick-up ability. Therefore, there is a case that the cut chip 5' is not picked up by the adsorption collet 12, as shown in the cross sectional diagram of FIG. 5(*c*).

In addition, the conventional wafer-dicing adhesive tape is cut completely into the base film thereof in general. In this case, the base film is molten by the blade, which is being rotated at high speed to be used for cutting, to generate so-called dicing waste in a filamentous form. However, in the present invention, the tape has a constitution such that the removable adhesive layer is laminated on the base film and the generation of dicing waste can be prevented by avoiding the blade to reach to the base film.

The radiation-polymerizable compound for use in the present invention is appropriately chosen depending on usage without any particular limitation. In the present invention, an acrylic resin is preferably used as a base resin. Examples thereof include an acrylic copolymer and a methacrylic copolymer (hereinafter, also referred to as (meth)acrylic copolymer). In such a case, one appropriately blended with a curing agent and cross-linked before the irradiation with radiation can be used. Examples of the (meth)acrylic copolymer include a polymer having a (meth)acrylate as a respective polymer constitutional unit, a (meth)acrylic polymer of a (meth)acrylate-series copolymer, a copolymer with a functional monomer, and mixtures of those polymers. Generally applied molecular weights of these polymers may be of higher molecular weights, weight average molecular weights of about 500,000 to 1,000,000.

The curing agent is used for adjusting temporary adhesive force and cohesive force by reacting with a functional group processed by the (meth)acrylic copolymer. Examples of the curing agent include: an epoxy compound having two or more epoxy groups in a molecule such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, and N,N,N',N'-tetraglycidyl-m-xylenediamine; an isocyanate-based compound having two or more isocyanate groups in a molecule such as 2,4-tolylene diisocyanate, 2,6-tolylene diisocyanate, 1,3-xylylene diisocyanate, 1,4-xylene diisocyanate, and diphenylmethane-4,4'-diisocyanate; and an aziridine-based compound having two or more aziridinyl groups in a molecule such as tetramethylol-tri-β-aziridinyl propionate, trimethylol-tri-β-aziridinyl propionate, trimethylolpropane-tri-β-aziridinyl propionate, and trimethylolpropane-tri-β-(2-methyl aziridine) propionate. The amount of the curing agent to be added may be adjusted depending upon a desired temporary adhesive force and cohesive force, and is adequately 0.1 to 5.0 parts by mass for 100 parts by mass of the (meth)acrylic copolymer.

A low molecular weight compound having at least two or more photopolymerizable carbon-carbon double bonds in a molecule capable of forming three-dimensional network through, for example, irradiation with light is widely used as the radiation-polymerizable compound. It is preferable that an oligomer having a weight average molecular weight (Mw) ranging from 100 to 30,000 be used. An example of such compound can include an oligomer having a functional group such as a hydroxyl group or a carboxyl group, such as a urethane acrylate, epoxy acrylate, polyester acrylate, polyether acrylate, (meth)acrylic oligomer, and itaconic oligomer.

In addition, specific examples of the compound that is applicable include: trimethylolpropane triacrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butyleneglycol diacrylate, 1,6-hexanediol diacrylate, polyethyleneglycol diacrylate, and oligoester acrylate; and urethane acrylate-based oligomers including one obtained by reacting acrylate or methacrylate having a hydroxyl group (for example, 2-hydroxyethyl acrylate, 2-hydroxyethyl methacrylate, 2-hydroxypropyl acrylate, 2-hydroxypropyl methacrylate, polyethyleneglycol acrylate, or polyethyleneglycol methacrylate) with an isocyanate-terminal urethane prepolymer obtained by reacting a polyvalent isocyanate compound (for example, 2,4-tolylene diisocyanate, 2,6-tolylene diisocyanate, 1,3-xylylene diisocyanate, 1,4-xylylene diisocianate, or diphenylmethane-4,4-diisocyanate) with a polyol compound in a polyester-type, a polyether-type, or the like.

This radiation-polymerizable compound contains an acrylic polymer having one or more radiation-polymerizable carbon-carbon double bonds on its side chain as a constitutional unit. The radiation-polymerizable compound having one or more radiation-polymerizable carbon-carbon double bonds on the side chain is a polymer having a carbon-carbon double bond in its molecule. For instance, the compound may be obtained by addition polymerization of a compound having one or more carbon-carbon double bonds to a homopolymer having an alkyl ester of acrylic acid or methacrylic acid as a main constitutional unit or to a copolymer of an alkyl ester of acrylic acid or methacrylic acid and another unsaturated monomer copolymerizable therewith. Preferably, this polymer has a weight average molecular weight of 10,000 to 1,000,000, while a glass-transition temperature thereof may be appropriately adjusted by changing the blending ratio of the alkyl ester.

Furthermore, in addition to the acrylic compounds as described above, a urethane acrylate-based oligomer can be used.

In the present invention, a content of the radiation-polymerizable compound in the resin composition that constitutes the outermost removable adhesive layer is different from that of the inner removable adhesive layer. According to such a constitution, it is possible to provide a difference in the temporary adhesion strength after irradiation with radiation between the outermost removable adhesive layer and the inner removable adhesive layer. In addition, because a stress applied to the base film is sufficiently introduced to the outermost removable adhesive layer irradiated with radiation, it is possible to easily peel off said layer from chips cut. Preferably, the content of the radiation-polymerizable compound in the composition of the outermost removable adhesive layer is determined so to be higher than that of the radiation-polymerizable compound in the composition of the inner removable adhesive layer. Such a constitution attains a sufficient reduction in the temporary adhesion strength of the outermost removable adhesive layer to be touched with the chips, when the chips are picked up after irradiation with radiation, to allow the chips to be easily delaminated. Particularly, when the chips are expanded and then picked up, the inner removable adhesive layer exhibits flexibility and thus the picking up can be carried out without allowing the removable adhesive layers to be delaminated from each other.

Furthermore, in the present invention, it is preferable that the content of the radiation-polymerizable compound in the composition of the outermost removable adhesive layer 1 is larger than that of the radiation-polymerizable compound in the composition of the inner removable adhesive layer 2; and that the resin composition constituting the outermost removable adhesive layer 1 contains 50 to 200 parts by mass of the radiation-polymerizable compound for 100 parts by mass of the acrylic base resin, and the resin composition constituting the inner removable adhesive layer 2 present in the inner part to the outermost removable adhesive layer 1 contains 5 to 100 parts by mass of the radiation-polymerizable compound for 100 parts by mass of the acrylic base resin. When the content of the radiation-polymerizable compound in the removable adhesive layer 1 is low, the content of the radiation-polymerizable compound in the removable adhesive layer 2 is high, and the content of the radiation-polymerizable compound in the resin composition constituting the outermost removable adhesive layer is smaller than the content of the radiation-polymerizable compound in the resin composition constituting the inner removable adhesive layer, the decrease in temporary adhesion strength of the outermost removable adhesive layer is insufficient and the inner removable adhesive layer is slightly hard. As a result, the thus-obtained tape has very bad property of picking up and cannot be developed to a practical level, as well as the expanded diameter of the wafer cannot attain a sufficient level.

If the content of the radiation-polymerizable compound in the resin composition constituting the outermost removable adhesive layer 1 is less than 50 parts by mass, a reduction in temporary adhesion strength is insufficient in some cases, so it becomes difficult to deal with comparatively large chips having a chip size of over 10 mm×10 mm. Too large content is unfavorable because no additional reduction in temporary adhesive strength may occur while an increase in cost may occur as an opposite effect.

Furthermore, if the content of the radiation-polymerizable compound in the resin composition constituting the inner removable adhesive layer 2 located on the inner side of the outermost removable adhesive layer 1 is less than 5 parts by mass, the content may become a cause of excess flexibility that may lead to a deterioration in property of picking up or may induce the contamination on the back side of the chips in some cases. In the present invention, the content is preferably 10 parts by mass or more and further preferably 15 parts by mass or more. To the contrary, if the content exceeds 100 parts by mass, the composition may become hardened, resulting in leading to deteriorations in properties of picking up and expanding, in some cases. A thickness ratio between the outermost removable adhesive layer 1 and the inner removable adhesive layer 2 varies depending on the relationship with the depth of the cutting blade or the compositions. Basically, however, only the peelability of the chips has to be taken into consideration for the outermost removable adhesive layer 1. The overall hardness varies depending on the inner removable adhesive layer 2. Therefore, the inner removable adhesive layer 2 is desirably thicker than the outermost removable adhesive layer 1. As for the respective thickness of the removable adhesive layers, the inner removable adhesive layer 2 has a thickness of preferably 5 to 70 µm, more preferably 5 to 20 µm. Further, the outermost removable adhesive layer 1 has a thickness of preferably 10 to 80 µm, more preferably 15 to 50 µm. However, the two or more removable adhesive layers defined in the present invention does not include removable adhesive layers produced by a method in which after the inner removable adhesive layer 2 has been hardened, the outermost removal adhesive layer 1 is provided.

Furthermore, in general, a photo-polymerization initiator is used when the removable adhesive layer obtained by means of those adjustments is brought into polymerization or curing through, for example, irradiation with ultraviolet rays or the like. Specific applicable examples of the initiator include isopropylbenzoin ether, isobutylbenzoin ether, benzophenone, Michler's ketone, chlorothioxanthone, dodecylthioxanthone, dimethylthioxanthone, diethylthioxanthone, benzyldimethylketal, α-hydroxycyclohexylphenylketone, and 2-hydroxymethylphenylpropane.

The base film 3 of the wafer-dicing adhesive tape 4 in the present invention is not specifically limited as far as the irradiation of the resin compositions constituting the removable adhesive layer is not prevented. For instance, as well as polyvinyl chloride and polyethylene, various ethylene-based copolymers such as an ethylene-vinyl acetate copolymer and an ethylene-(meth)acrylate copolymer, and various elastomers, polyesters, and nylon-series can be applied. In addition, the thickness of the base film 3 to be applied is not particularly limited, but generally in the range of about 30 to 500 µm in terms of workability and the like.

The present invention will be described in more detail based on examples given below, but the invention is not meant to be limited by these.

EXAMPLES

Examples 1 to 9 and Comparative Examples 1 to 4

<Acrylic Base Resin>
A copolymer containing 2-ethylhexyl acrylate, methyl acrylate, and 2-hydroxyethyl acrylate was used.
<Radiation-polymerizable Compound>
A radiation-curable acrylic polymer obtained by addition of 5 parts by mass of 2-isocyanate ethylmethacrylate as a compound having one or more radiation-polymerizable carbon-carbon double bonds to 100 parts by mass of a polymer obtained by copolymerizing butyl acrylate, 2-ethylhexyl acrylate, methyl methacrylate, and 2-hydroxyethyl acrylate was used.
<Preparation of Removable Adhesive Agent>
A removable adhesive agent was obtained by: adding 100 parts by mass of the above acrylic base resin with 3 parts by mass of a polyisocyanate compound (trade name: Colonate L, manufactured by Nippon Polyurethane Industry Co., Ltd.) as a curing agent, predetermined mixing parts of the above radiation-polymerizable compound described in the examples and comparative examples, and 1 part by mass of α-hydroxycyclohexyl phenylketone as a photo polymerization initiator; and mixing them together.
<Production of Wafer-dicing Adhesive Tape>
A base film of 100 µm in thickness was prepared by the T-die extrusion method using an EMMA resin (trade name: Acrift WD201, manufactured by Sumitomo Chemical Industrial Co., Ltd.). Subsequently, on the base film, an inner removable adhesive layer (Removable adhesive layer 2) and an outermost removable adhesive layer (Removable adhesive layer 1) having the compositions shown in the examples and comparative examples in Tables 1 and 2 were applied in this order such that the inner removable adhesive layer had a thickness of 35 µm and the outermost removable adhesive layer had a thickness of 10 µm, thereby obtaining an wafer-dicing adhesive tape.

<Evaluation>

The respective wafer-dicing adhesive tapes of the examples and comparative examples in Tables 1 and 2 were applied and fixed on an 8-inch ring frame. While being applied and fixed, an 8-inch silicon wafer of 100 μm in thickness was applied on the wafer-dicing adhesive tape and then cut into chips of 5 mm×5 mm in size as full-cut dicing with a dicing machine DAD340 (trade name) manufactured by Disco, Co., Ltd. In this process, the depths of the cutting blade from the tape surface were those represented in Tables 1 and 2, respectively. After dicing, from the back side of the tape, irradiation was carried out by means of an ultraviolet irradiator with a high-pressure mercury-vapor lamp at an exposure dose of 500 mJ/cm$^2$. After the UV irradiation, chips were picked up in a state of being expanded with an expand stroke of 12 mm by using CPS-100FM (trade name) manufactured by NEC Machinery, Inc. The pick up was carried out using pushing-up pins of R250 in tip radius. Evaluations were carried out for items described below. The results were shown in Tables 1 and 2.

<Numbers of Generated Filamentous Dicing Wastes>

The numbers of filamentous dicing wastes generated from the tape by dicing were counted by microscopical observation. The observation was carried out for five scribing lines.

<Presence or Absence of Fine Powdery Cutting Wastes Generated>

The numbers of the powdery cutting wastes generated from the removable adhesive layers by dicing and adhered on the wafer were counted by microscopical observation so that the presence or absence of the wastes was confirmed.

<Evaluation on the Property of Picking Up>

Chips were actually picked up using CPS-100FM (trade name) manufactured by MEC Machinery Inc. with expand strokes of 2 mm and 12 mm, respectively, so that whether the chips could be pulled up, adsorbed in a circular collet, and mounted on a lead frame was evaluated. The evaluation was conducted in the view how many chips, among 200 chips, were successfully picked up from the 8-inch wafer.

<Expanding Property>

The expanding rate of the diameters of the wafer (the diameter of the wafer at expanding/the original diameter of the 8-inch wafer), when the wafer was expanded with an expanding stroke of 12 mm, and the presence or absence of breaking of the dicing tape were observed, respectively.

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| Removable adhesive layer 1 | Radiation-polymerizable compound (parts by mass) | 100 | 190 | 210 | 45 | 150 | 150 | 150 | 150 | 150 |
|  | Acrylic removable adhesive agent (parts by mass) | 100 | 100 | 100 | 100 | 100 | 100 | 100 | 100 | 100 |
| Removable adhesive layer 2 | Radiation-polymerizable compound (parts by mass) | 50 | 50 | 50 | 35 | 120 | 25 | 5 | 10 | 15 |
|  | Acrylic removable adhesive agent (parts by mass) | 100 | 100 | 100 | 100 | 100 | 100 | 100 | 100 | 100 |
| Depth of cutting blade from tape surface at dicing (μm) |  | 30 | 30 | 30 | 30 | 30 | 30 | 30 | 30 | 30 |
| Numbers of generated filamentous dicing wastes |  | 0 | 0 | 0 | 0 | 0 | 0 | 0 | 0 | 0 |
| Presence or absence of fine powdery cutting wastes generated |  | Absence | Absence | Absence | Absence | Absence | Absence | Absence | Absence | Absence |
| Evaluation on the property of picking up |  | 200/200 | 200/200 | 200/200 | 173/200 | 191/200 | 180/200 | 150/200 | 162/200 | 170/200 |
| Expanding ratio of diameter of the wafer |  | 105% | 104% | 104% | 105% | 101% | 106% | 108% | 107% | 106% |
| Presence or absence of breaking of the tape |  | Absence | Absence | Absence | Absence | Absence | Absence | Absence | Absence | Absence |

TABLE 2

|  |  | Comparative Example 1 | Comparative Example 2 | Comparative Example 3 | Comparative Example 4 |
|---|---|---|---|---|---|
| Removable adhesive layer 1 | Radiation-polymerizable compound (parts by mass) | 100 | 100 | 0 | 190 |
|  | Acrylic removable adhesive agent (parts by mass) | 100 | 100 | 100 (*1) | 100 |
| Removable adhesive layer 2 | Radiation-polymerizable compound (parts by mass) | 50 | 0 | 50 | 190 |
|  | Acrylic removable adhesive agent (parts by mass) | 100 (*2) | 100 (*3) | 100 | 100 |
| Depth of cutting blade from tape surface at dicing (μm) |  | 30 | 30 | 30 | 30 |
| Numbers of generated filamentous dicing wastes |  | 0 | 0 | 0 | 0 |

TABLE 2-continued

|  | Comparative Example 1 | Comparative Example 2 | Comparative Example 3 | Comparative Example 4 |
|---|---|---|---|---|
| Presence or absence of fine powdery cutting wastes generated | Presence: Many cutting powders adhered on the wafer | Absence | Absence | Absence |
| Evaluation on the property of picking up | 200/200 | 0/200 | 7/200 | Unevaluable due to tape breakage |
| Expanding ratio of diameter of the wafer | 105% | 108% | 104% | Unevaluable due to tape breakage |
| Presence or absence of breaking of the tape | Absence | Absence | Absence | Tape breakage at the scribing line portion |

(*1) Non-radiation-curable type removable adhesive layer composed only of an acrylic removable adhesive agent
(*2) After application, the layer was cured by UV irradiation before applying the removable adhesive layer 1.
(*3) Non-radiation-curable type removable adhesive layer composed only of an acrylic removable adhesive agent From Tables 1 to 2, the following is proven.

As is shown from Examples 1 to 3, the diameter of the wafer can be sufficiently expanded at an expanding stroke of 12 mm without causing filamentous dicing waste or fine powdery cutting waste and without any problem in property of picking up. Furthermore, in Example 4, the content of the radiation-polymerizable compound of the removable adhesive layer 1 was slightly low, so that the property of picking up was at a lower level. In this case, however, good results were obtained with respect to other items without any problem, just as in the cases of Examples 1 to 3. In Examples 6, 7, 8, and 9, the property of picking up was at a lower level because the content of the radiation-polymerizable compound of the removable adhesive layer 2 was slightly low. In these cases, however, good results were obtained with respect to other items without any problem, just as in the cases of Examples 1 to 3. Furthermore, in Example 5, because the content of the radiation-polymerizable compound of the removable adhesive layer 2 was slightly high, the layer was hardened after the UV irradiation. Thus, the expanded diameter of the wafer by expanding was not necessarily sufficient. Besides, the property of picking up was at a lower level because the hardened removable layer was expanded at a stroke of 12 mm. In this case, however, good results were obtained with respect to other items without any problem, just as in the cases of Examples 1 to 3.

In contrast, in Comparative Example 1, the removable adhesive layer 2 was previously hardened by irradiation with radiation. Thus, a large amount of cutting powders was generated from the removable adhesive layer 2 at the time of cutting with the blade and then adhered on the wafer, so that the product of Comparative Example 1 could not be developed to a practical level. In Comparative Example 2, the removable adhesive layer 2 did not contain a radiation-curable type removable adhesive agent and it was kept in a soft state even after UV irradiation. Therefore, the stress of pushing up by the pushing-up pins upon picking up was absorbed by the soft removable adhesive layer 2, so that the chips could not be picked up at all.

In Comparative Example 3, the removable adhesive layer 1 did not contain a radiation-curable type removable adhesive agent, so that the temporary adhesion strength could not be decreased. As a result, the chips could be hardly picked up. Furthermore, in Comparative Example 4, the content rates of the radiation-polymerizable compound with respect to an acrylic removable adhesive agent in the removable adhesive layer 1 and that in the removable adhesive layer 2 were equal. Besides, the content of the radiation-polymerizable compound itself was high and both layers were hardened too much after the UV irradiation, thereby breaking at scribing line portions with an expanding stroke of 12 mm.

INDUSTRIAL APPLICABILITY

The wafer-dicing adhesive tape of the present invention can be used for supporting and fixing a work to be cut, such as a wafer, when the work to be cut is subjected to processing. Furthermore, in the method of producing chips using the same, semiconductor chips being advanced with respect to thin thickness and a small size can be efficiently produced without generating cutting waste at the time of dicing.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A wafer-dicing adhesive tape, comprising an outermost removable adhesive layer and an innermost removable adhesive layer on one side of a base film,
   wherein each of said outermost removable adhesive layer and said innermost removable adhesive layer has a resin composition containing a radiation-polymerizable compound, and are in the unhardened state having not been irradiated with radiation, and
   wherein said innermost removable adhesive layer is in contact with said base film and said outermost removable adhesive layer is in contact with said innermost removable adhesive layer, and
   wherein a content of the radiation-polymerizable compound in the resin composition constituting an outermost removable adhesive layer is larger than the content of the radiation-polymerizable compound in the resin composition constituting the innermost removable adhesive layer, such that the innermost removable adhesive layer exhibits flexibility after irradiation and the outermost removable adhesive layer exhibits a reduction in temporary adhesion strength after irradiation
   and wherein the resin composition constituting the outermost removable adhesive layer contains 50 to 200 parts by mass of the radiation-polymerizable compound for 100 parts by mass of an acrylic base resin, and
   wherein the resin composition constituting the innermost removable adhesive layer contains 5 to 100 parts by mass of the radiation-polymerizable compound for 100 parts by mass of an acrylic base resin; and
   wherein a stress applied to the base film is sufficiently introduced to the outermost removable adhesive layer irradiated with radiation, so that said outermost removable adhesive layer can be easily peeled off from chips cut.

2. The wafer-dicing adhesive tape according to claim 1, wherein the innermost removable adhesive layer is thicker than the outermost removable adhesive layer.

3. The wafer-dicing adhesive tape according to claim 2, wherein the thickness of the outermost removable adhesive layer is 10 to 80 μm.

4. The wafer-dicing adhesive tape according to claim 2, wherein the thickness of the innermost removable adhesive layer is 5 to 70 μm.

5. The wafer-dicing adhesive tape according to claim 2, wherein the radiation-polymerizable compound is a polymer containing an acrylic monomer having one or more radiation-polymerizable carbon-carbon double bonds on its side chain as a constitutional unit.

6. The wafer-dicing adhesive tape according to claim 1, wherein the innermost removable adhesive layer is thicker than the outermost removable adhesive layer, the thickness of the outermost removable adhesive layer is 10 to 80 μm, and the thickness of the innermost removable adhesive layer is 5 to 70 μm.

7. The wafer-dicing adhesive tape according to claim 1, wherein the radiation-polymerizable compound is a polymer containing an acrylic monomer having one or more radiation-polymerizable carbon-carbon double bonds on its side chain as a constitutional unit.

8. A method of producing chips, comprising the steps of:
supporting and fixing a wafer as a work to be cut with the wafer-dicing adhesive tape according to claim 1;
dicing the wafer such that a lowest part of cutting blade reaches inside of the outermost layer of the wafer-dicing adhesive tape or the inner removable adhesive layer present in the inner part to the outermost layer;
irradiating the wafer-dicing adhesive tape with radiation; and
picking up the thus-obtained chips cut.

* * * * *